United States Patent
Zweigle et al.

(10) Patent No.: US 11,178,780 B2
(45) Date of Patent: Nov. 16, 2021

(54) FLOATING BEARING BUSH FOR A PRINTED CIRCUIT BOARD

(71) Applicant: Robert Bosch GmbH, Stuttgart (DE)

(72) Inventors: Peter Zweigle, Ditzingen (DE); Martin Gerhaeusser, Brackenheim-Stockheim (DE)

(73) Assignee: Robert Bosch GmbH, Stuttgart (DE)

( * ) Notice: Subject to any disclaimer, the term of this patent is extended or adjusted under 35 U.S.C. 154(b) by 451 days.

(21) Appl. No.: 16/330,638

(22) PCT Filed: Aug. 2, 2017

(86) PCT No.: PCT/EP2017/069523
§ 371 (c)(1),
(2) Date: Mar. 5, 2019

(87) PCT Pub. No.: WO2018/041509
PCT Pub. Date: Mar. 8, 2018

(65) Prior Publication Data
US 2021/0289640 A1 Sep. 16, 2021

(30) Foreign Application Priority Data
Sep. 5, 2016 (DE) .................... 10 2016 216 739.1

(51) Int. Cl.
*H05K 1/00* (2006.01)
*H05K 1/18* (2006.01)
(Continued)

(52) U.S. Cl.
CPC ........... *H05K 5/0082* (2013.01); *H05K 3/284* (2013.01)

(58) Field of Classification Search
CPC .................... H05K 5/0082; H05K 3/284
(Continued)

(56) References Cited

U.S. PATENT DOCUMENTS

| | | | |
|---|---|---|---|
| 2011/0085305 A1 | 4/2011 | Ochi et al. | |
| 2015/0333596 A1* | 11/2015 | Berkouk | H05K 1/18 310/71 |
| 2016/0097424 A1* | 4/2016 | Hafermalz | B62D 5/0409 74/425 |

FOREIGN PATENT DOCUMENTS

| | | |
|---|---|---|
| CN | 103925285 A | 7/2014 |
| DE | 44 05 710 A1 | 8/1995 |

(Continued)

OTHER PUBLICATIONS

International Search Report corresponding to PCT Application No. PCT/EP2017/069523, dated Nov. 6, 2017 (German and English language document) (7 pages).

*Primary Examiner* — Andargie M Aychillhum
(74) *Attorney, Agent, or Firm* — Maginot, Moore & Beck LLP

(57) ABSTRACT

A floating bearing bush for bearing a printed circuit board includes a bearing ring and a soldering ring. The bearing ring includes a tubular opening for receiving a fastening bolt. The soldering ring surrounds the bearing ring and is configured to be soldered by a lower edge onto a printed circuit board. The lower edge of the soldering ring is provided by a continuous wall which is configured to keep a liquid potting compound away from the interior of the soldering ring. The bearing ring is movably suspended within the soldering ring, with the result that the bearing ring is movable at least in a radial direction with respect to the soldering ring.

10 Claims, 3 Drawing Sheets

(51) Int. Cl.
*H05K 7/00* (2006.01)
*H05K 5/00* (2006.01)
*H05K 3/28* (2006.01)

(58) Field of Classification Search
USPC .......................................................... 361/748
See application file for complete search history.

(56) References Cited

FOREIGN PATENT DOCUMENTS

| | | |
|---|---|---|
| DE | 10 2010 030 170 A1 | 12/2011 |
| DE | 10 2014 217 351 A1 | 3/2016 |
| DE | 10 2014 217 889 A1 | 3/2016 |
| EP | 2 458 951 A2 | 5/2012 |
| JP | 2006-222341 * | 8/2006 |

* cited by examiner

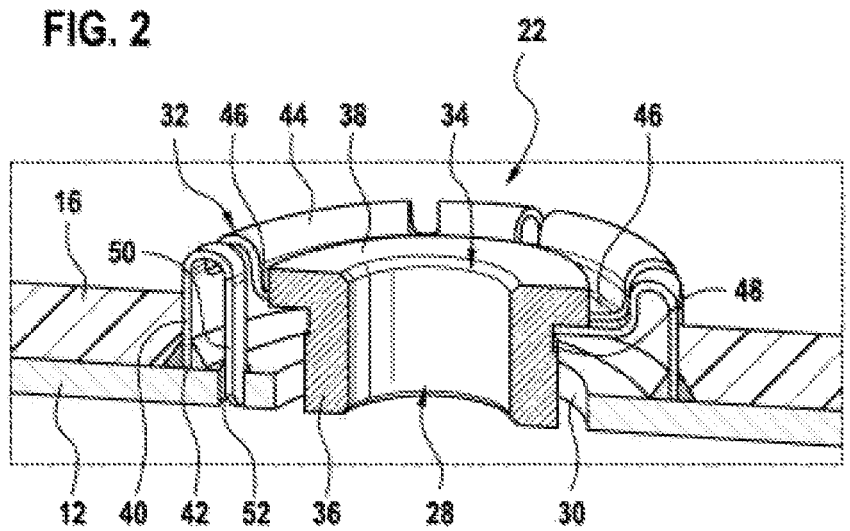
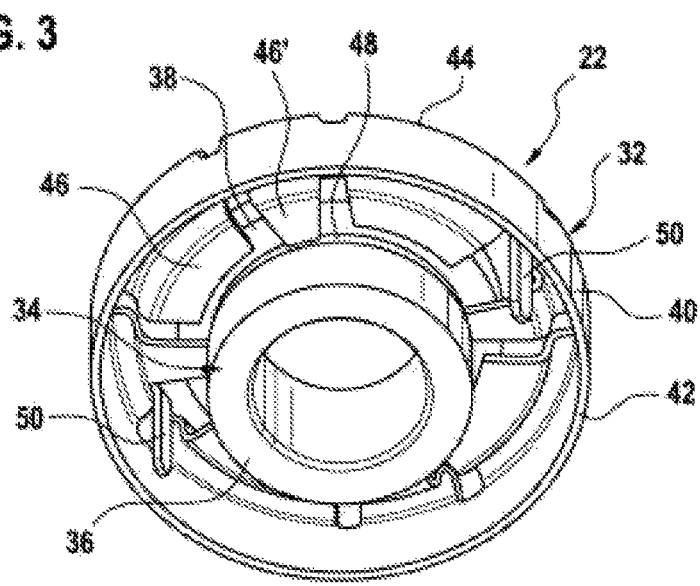

FLOATING BEARING BUSH FOR A PRINTED CIRCUIT BOARD

This application is a 35 U.S.C. § 371 National Stage Application of PCT/EP2017/069523, filed on Aug. 2, 2017, which claims the benefit of priority to Serial No. DE 10 2016 216 739.1, filed on Sep. 5, 2016 in Germany, the disclosures of which are incorporated herein by reference in their entirety.

The disclosure relates to a floating bearing bush and to a control module for a vehicle.

BACKGROUND

The electronic circuitry of transmission control modules can be disposed on a printed circuit board. Furthermore, the components of the circuitry can be protected from engine oil, transmission oil, other media and short-circuiting by shavings by way of a protective casting, for example by dam-and-fill technology. In the case of the dam-and-fill method a dam from a highly viscous material is first generated about the electronic components on the printed circuit board, and the tub created is filled with a substantially less viscous casting compound which covers the electronic components.

The printed circuit board is typically fastened by screw-fitting to a support such as, for instance, a support plate, a housing, or an assembly face (the transmission housing, for example). The printed circuit board in turn is fastened to the support such that different thermal expansions do not lead to any damage. Because of the different thermal expansion coefficients between the support and the printed circuit board material, one fastening point is embodied as a fixed bearing, and further fastening points are embodied as floating bearings.

The printed circuit board is usually not suitable for transmitting the pre-tensioning force of the screw.

Therefore, metal bushes are in most instances used for receiving screws, said metal bushes reducing the surface compression. The fixed bearing bush can be soldered directly onto the printed circuit board or be press-fitted into the latter, for example.

DE 10 2010 030 170 A1 shows a control apparatus in which a frame is disposed on a circuitry support such that a tub which is filled with a molding compound is formed.

DE 44 05 710 A1 shows a support plate having construction elements which are surrounded by a ring into which a gel is filled.

SUMMARY

Embodiments of the disclosure can advantageously enable a printed circuit board having electronic components cast in a casting compound to be securely fixed to a support. Furthermore, a compact and cost-effective control module which is adapted to the environmental conditions in the engine bay of a vehicle can be provided.

Ideas pertaining to embodiments of the disclosure can inter alia be considered as being based on the concepts and insights described hereunder.

One aspect of the disclosure relates to a floating bearing bush for mounting a printed circuit board. One or a plurality of said floating bearing bushes can be soldered to the printed circuit board so as to fasten the latter to a support.

According to one embodiment of the disclosure the floating bearing bush comprises a bearing ring having a tubular opening for receiving a fastening bolt, and a soldering ring which surrounds the bearing ring and which by way of a lower edge is embodied so as to be soldered to a printed circuit board, wherein the lower edge of the soldering ring is provided by a continuous wall which is embodied so as to keep a liquid casting compound away from the interior of the soldering ring. The bearing ring within the soldering ring is suspended or mounted, respectively, so as to be movable such that the bearing ring is movable at least in a radial direction in relation to the soldering ring. In this way, a fastening bolt which goes through the bearing ring and which is fastened in a support can move in relation to the printed circuit board when the support thermally expands differently than the printed circuit board.

Overall, the floating bearing bush can provide a radial clearance for fastening the printed circuit board and simultaneously prevent that casting compound from leaking into a region in which said clearance is provided.

The printed circuit board can be produced from glass-fiber-reinforced plastics material onto which copper layers as conductor paths are applied. The floating bearing bush can also be soldered to a copper layer of this type. The printed circuit board can support electronic components such as, for instance, resistors, capacitors, semiconductor circuit elements and/or integrated circuits which form an electronic circuitry. The floating bearing bush, conjointly with the electronic components, can be soldered to the printed circuit board by the SMD reflow method.

The floating bearing bush and the electronic components can then be cast by the dam-and-fill method. That is to say that the printed circuit board can have a dam which surrounds the electronic components and the floating bearing bush and within which a casting compound in which the electronic components and the floating bearing bush are embedded is cast. The soldering ring herein prevents that casting compound in casting from making its way into the interior of the floating bearing bush. The leakage of the protective casting compound is prevented on account of the embodiment of the floating bearing bush which up to the required height is circumferentially closed by way of a continuous wall, without any further measures such as, for example, a further dam, being required. Expensive dam material can thus be saved, wherein additional parts and operating steps are avoided. Furthermore, a saving in terms of space can be achieved.

The soldering ring, which can be produced from sheet metal, can be joined together, such as welded, for instance, from a plurality of elements. The sheet metal can be bent so as to form a ring which provides the wall. The wall can be round and/or tubular. Bearing elements for supporting the bearing ring, bores and/or guide pins for the exact positioning can be situated in regions of the soldering ring which do not contact the casting compound. These elements can also be produced from the sheet metal. However, it is also possible for the wall of the soldering ring not to be round but to have an arbitrary shape such as, for instance, a polygon.

According to one embodiment of the disclosure the bearing ring by way of a periphery that projects radially outward is placed on bearing elements of the soldering ring that project inward. The bearing ring can thus laterally slide on the bearing elements. The bearing elements can be sheet-metal tongues which project inward from the wall. The bearing elements can in particular be flexible tongues. A thickness tolerance of the printed circuit board can be equalized by flexible tongues, and/or the printed circuit board can always be sufficiently pressed against the support by way of said flexible tongues. The contact pressure force can simultaneously be set so low that any lateral displacement of the printed circuit board is not impeded.

According to one embodiment of the disclosure the bearing elements project radially inward. For example, flexible tongues can be formed by sheet-metal strips that are bent inward.

According to one embodiment of the disclosure the bearing elements in the circumferential direction are bent about the bearing ring. In this way, a higher elasticity of the bearing elements, or of flexible tongues, respectively, can be achieved.

According to one embodiment of the disclosure the bearing ring is movable relative to the bearing elements. For example, the bearing ring can have an undercut, or a radial depression, respectively, into which the bearing elements protrude. Said depression can have a clearance in relation to the bearing elements such that the bearing ring is movable in the radial direction. By way of said undercut it can also be achieved that the bearing ring and the soldering ring are assembled on one another also in transport and cannot fall apart.

According to one embodiment of the disclosure the soldering ring in an upper portion provides elastic bearing elements or flexible tongues, respectively, by way of which the bearing ring is mounted in the soldering ring, wherein the elastic bearing elements are provided by portions, for example sheet-metal strips, of the soldering ring that are bent inward.

According to one embodiment of the disclosure the bearing ring is jammed into the elastic bearing elements. It is also possible for the bearing ring not to be movable in relation to the bearing elements but for a movement of the bearing ring to able to be performed only by way of an elastic deformation of the bearing elements.

According to one embodiment of the disclosure an upper portion of the soldering ring is bent in an arcuate inward manner by more than 90°. Furthermore, bearing elements for the bearing ring can be attached to the upper portion in a radially inward manner. The soldering ring can be produced from a sheet metal which in a lower portion provides the wall and which for forming the upper portion has been bent inward. The bearing elements can also have been punched from said sheet metal, said bearing elements adjoining the upper portion and in turn having been bent such that said bearing elements point radially inward.

According to one embodiment of the disclosure the soldering ring has a guide pin which from an upper portion of the soldering ring protrudes beyond the lower edge of the soldering ring. The guide pin can be plugged into a guide bore in the printed circuit board so as to fix the soldering ring or the floating bearing bush, respectively, prior to the soldering. The guide pin can also be punched from the sheet metal from which the wall and the bearing elements of the soldering ring are formed.

However, it is also possible that the positioning of the floating bearing bush takes place only by way of the fitting into the soldering paste and the soldering procedure, without any guide elements being present.

A further aspect of the disclosure relates to a control module for an apparatus of a vehicle. The control module can comprise a printed circuit board, as has been described above and hereunder, having electronic components for controlling the apparatus which can be, for example, a transmission, or an automatic transmission, respectively. Apart from the electronic components which can form a control circuitry, the control module can comprise electronic connectors, sensors and/or actuators, or contact the latter, respectively. The control module, by way of the printed circuit board, can be attached to the apparatus, for example a transmission and can also be electrically connected to said apparatus. The vehicle can be a passenger motor vehicle, a commercial motor vehicle, or a bus.

According to one embodiment of the disclosure the control module comprises a printed circuit board which supports electronic components for controlling an apparatus of the vehicle; a dam which is applied to the printed circuit board and which surrounds the electronic components on the printed circuit board; a casting compound in which the electronic components are embedded and which is cast within the dam on the printed circuit board. The control module furthermore comprises a floating bearing bush which within the dam is soldered to the printed circuit board and which has a bearing ring having a tubular opening for receiving a fastening bolt, and a soldering ring which surrounds the bearing ring and which by way of a lower edge is soldered to the printed circuit board, wherein the soldering ring is cast in the casting compound, and wherein the bearing ring within the soldering ring is suspended so as to be movable such that the bearing ring is movable at least in a radial direction in relation to the soldering ring.

The soldering ring can have a wall which in casting protects the interior of the soldering ring, that is to say the region in which the bearing ring is received, from being filled with casting compound. The soldering ring, like the electronic components, can thus be mounted on the printed circuit board and cast in the casting compound. After the casting, an upper portion of the soldering ring can protrude from the casting compound.

The fastening bolt can be a screw by way of which the control module, or the printed circuit board, respectively, is screw-fitted to a support, for example a support plate or a housing. The bearing ring can protrude through the printed circuit board by way of a bore in the printed circuit board, so that the fastening bolt can be guided through the printed circuit board.

According to one embodiment of the disclosure the control module furthermore comprises a fixed bearing bush which within the dam is soldered to the printed circuit board and which provides an opening which for receiving a fastening bolt opens into a further bore in the printed circuit board. The control module, or the printed circuit board, respectively, will typically be fastened to the support by way of a (single) fixed bearing bush and a plurality of floating bearing bushes.

BRIEF DESCRIPTION OF THE DRAWINGS

Embodiments of the disclosure will be described hereunder with reference to the appended drawings, wherein neither the drawings nor the description are to be interpreted as limiting the disclosure. In the drawings:

FIG. 2 schematically shows a partial cross section through a control module according to one further embodiment of the disclosure;

FIG. 3 shows a perspective view of a floating bearing bush according to one embodiment of the disclosure;

The figures are merely schematic and not true to scale. In the figures, the same or functionally equivalent features are identified by the same reference signs.

DETAILED DESCRIPTION

Figure 1:
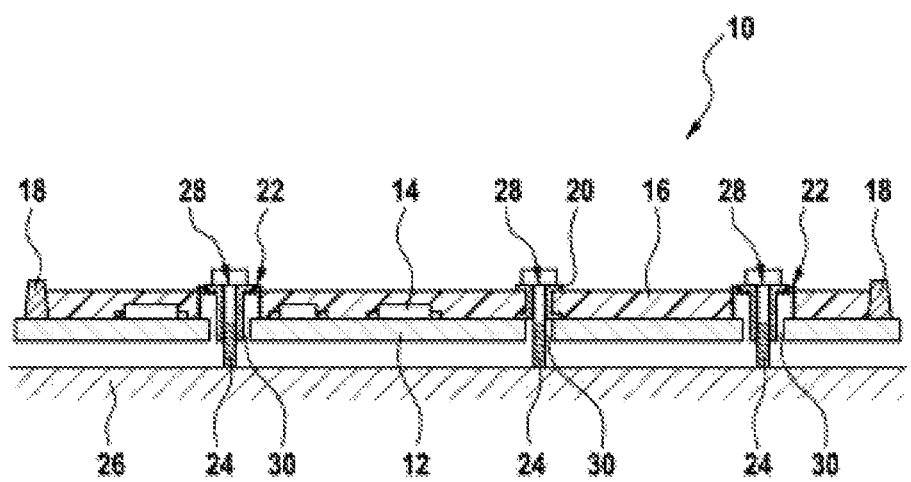
FIG. 1 schematically shows a cross-section through a control module according to one embodiment of the disclosure.

FIG. 1 shows a transmission control module 10 which comprises a printed circuit board 12 to which electronic components 14 which are embedded in a casting compound 16 are attached. The electronic components 14 are surrounded by a dam 18 which, for example, can run in portions on the periphery of the printed circuit board 12. Electronic components 14 can form a circuitry by way of which an apparatus such as, for instance, an automatic transmission, in a vehicle can be controlled.

The dam 18, conjointly with the printed circuit board 12, forms a tub in which the electronic components 14 are situated and in which said electronic components 14 are cast in the first casting compound 16. For example, the dam 18 can be applied as a plastics material having a high viscosity to the printed circuit board 12, and the casting compound 16 as a plastics material having a lower viscosity can then be cast within the dam 18. Plastics materials can subsequently be cured.

Furthermore, a fixed bearing bush 20 and a plurality of floating bearing bushes 22, by way of which the printed circuit board 12 by means of fastening bolts 24 (such as, for instance, screws) is fastened to a support 26 which can be, for example, the housing of an automatic transmission, are attached to the mounting side of the printed circuit board 12 on which the electronic components are situated.

The fixed bearing bush 20 and the floating bearing bushes 22 are soldered to the printed circuit board 12 and cast in the casting compound 16, wherein an upper portion protrudes from the casting compound 16. Both the fixed bearing bush 20 as well as the floating bearing bushes 22 have in each case one opening 28 which is disposed above a bore 30 in the printed circuit board 12 and through which the respective fasting pin 24 is plugged.

FIG. 2 shows a floating bearing bush 20 in more detail. The floating bearing bush 22 has a soldering 32 in which a bearing ring 34 is mounted.

The bearing ring 34 is substantially cylindrical and provides the opening 28 which serves for receiving the fastening bolt 24. A lower part of the cylindrical body 36 of the bearing ring 34 protrudes through the bore 30 in the printed circuit board 12 which has a larger diameter than the cylindrical body 36. The bearing ring 34 at an upper end has a radially outward projecting periphery 38 which has a larger diameter than the bore 30 in the printed circuit board and by which the bearing ring 34 is placed onto the soldering ring.

The soldering ring 32 has an external wall 40 which by way of a lower edge 42 is soldered to the printed circuit board 12. Said wall 40 as well as the soldering ring 32 can be made in one piece or a plurality of pieces. The wall 40 can furthermore be round or polygonal. For example, the soldering ring 32 can be produced from a sheet metal which is bent so as to form the soldering ring 32 and is then welded in order for the wall to be closed.

The wall 40 is continuous and up to an upper portion 44 of the soldering ring 32 does not have any bores or recesses such that no casting compound can make its way into the interior of the soldering ring 32 in casting.

The upper portion 44 of the soldering ring 32 is bent inward in a U-shaped manner. Said upper portion 44 adjacent thereto has a plurality of bearing elements 46 in the form of flexible tongues 46 which run in a radially inward manner and onto which the bearing ring is placed. The soldering ring 32 from the upper portion 44 has radial incisions which mutually separate the bearing elements 46.

The bearing ring 34 directly below the periphery 38 has an undercut 48, or an annular depression 48, respectively, into which the bearing elements 46 by way of the tips thereof are plugged. The bearing ring 34 and the bearing elements 46 can bear on one another in the undercut 48, or a spacing which permits a radial movement of the bearing ring 34 relative to the bearing elements 46 can be present. In the absence of said spacing, a movement of the bearing bush 34 in the radial direction as well as in the axial direction relative to the printed circuit board 12 can be guaranteed by the elastic bearing elements 46.

A guide pin 50 which from the upper portion 44 of the soldering ring 32 runs downward so as to be substantially parallel with the wall 40 and which is plugged into a further bore 52 in the printed circuit board 12 can furthermore be seen in FIG. 2. The guide pin 50 serves for fixing and positioning the floating bearing bush 22 on the printed circuit board 12 before the floating bearing bush 22 is soldered to the latter.

FIG. 3 shows the floating bearing bush 22 from FIG. 2 from below. It can be seen that the floating bearing bush 22 has two guide pins 50 that lie opposite one another. It can furthermore be seen that the bearing ring 34 is placed on first bearing elements 46, a spacing being present between the tips of said bearing elements 46 and the cylindrical body 36, and that the bearing ring has further bearing elements 46', the tips thereof being plugged into the undercut 48. Both types of bearing elements 46' run in a radially inward manner and/or taper in a radially inward manner. The bearing elements 46 in the circumferential direction are wider than the bearing elements 46'.

Figure 4:
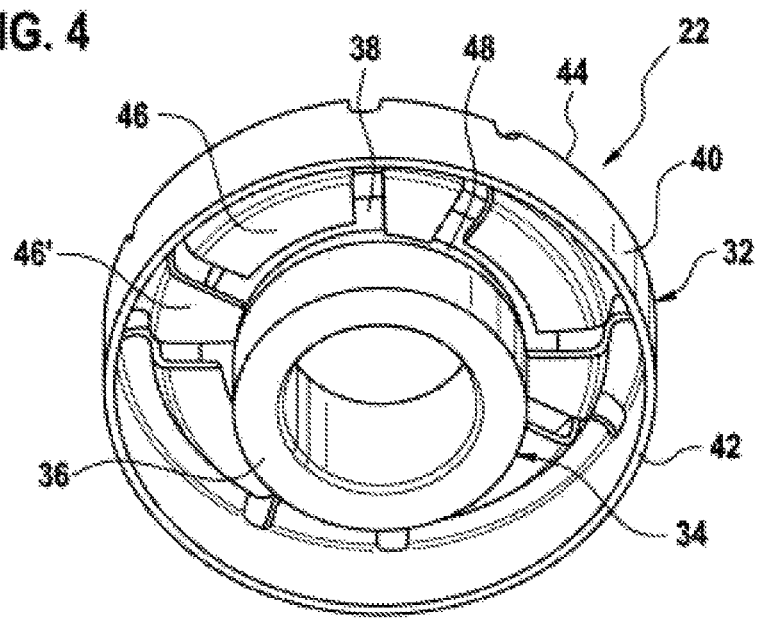
FIG. 4 shows a perspective view of a floating bearing bush according to one further embodiment of the disclosure.

FIG. 4 shows a floating bearing bush 22 in a manner analogous to that of FIG. 3, however not comprising any guide pins 50. As is the case in FIG. 4, the bearing elements 46 and 46' are disposed so as to be alternating in the circumferential direction.

Figure 5:
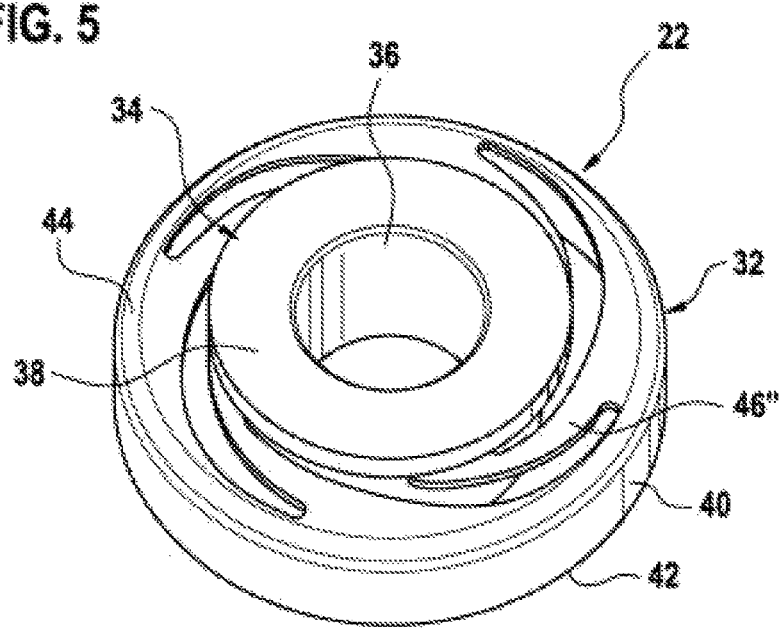
FIG. 5 shows a perspective view of a floating bearing bush according to one further embodiment of the disclosure.

FIG. 5 shows a further embodiment of a floating bearing bush 22, in which the upper portion is only curved by 90°, and the bearing elements, or flexible tongues 46", respectively, projecting inward therefrom are curved in the circumferential direction about the bearing ring 34. This can increase the elasticity of the bearing elements 46". The bearing elements 46" can also taper toward the bearing ring 34.

It is finally to be pointed out that terms such as "having", "comprising", etc., do not exclude any other elements or steps, and terms such as "a" or "one" do not exclude any multiplicity. Reference signs in the claims are not intended to be considered as a limitation.

The invention claimed is:

1. A floating bearing bush for mounting a printed circuit board, comprising:
   a bearing ring including a tubular opening configured to receive a fastening bolt; and
   a soldering ring surrounding the bearing ring and including a continuous wall having a lower edge, the lower edge soldered to the printed circuit board,
   wherein the continuous wall is configured to keep a liquid casting compound away from an interior of the soldering ring, and
   wherein the bearing ring is suspended within the soldering ring, such that the bearing ring is movable at least in a radial direction relative to the soldering ring.

2. The floating bearing bush as claimed in claim 1, wherein:
  the bearing ring includes a periphery that projects radially outward; and
  the bearing ring is placed on bearing elements of the soldering ring that project inward via the periphery.

3. The floating bearing bush as claimed in claim 2, wherein the bearing elements project radially inward or are curved around the bearing ring in a circumferential direction.

4. The floating bearing bush as claimed in claim 2, wherein the bearing ring is movable relative to the bearing elements.

5. The floating bearing bush as claimed in claim 2, wherein:
  the soldering ring includes an upper portion having elastic the bearing elements;
  the bearing elements are elastic; and
  the bearing ring is mounted in the soldering ring via the elastic bearing elements and/or the elastic bearing elements are defined by portions of the soldering ring that are bent inward.

6. The floating bearing bush as claimed in claim 5, wherein the bearing ring is jammed into the elastic bearing elements.

7. The floating bearing bush as claimed in claim 1, wherein:
  an upper portion of the soldering ring is bent in an arcuate inward manner by more than 90°; and
  bearing elements configured for the bearing ring are attached to the upper portion in a radially inward manner.

8. The floating bearing bush as claimed in claim 1, wherein the soldering ring includes a guide pin that protrudes from an upper portion of the soldering ring beyond the lower edge of the soldering ring.

9. A control module for a vehicle, comprising:
  a printed circuit board supporting electronic components configured to control an apparatus of the vehicle;
  a dam applied to the printed circuit board and surrounding the electronic components on the printed circuit board;
  a casting compound cast within the dam on the printed circuit board and in which the electronic components are embedded; and
  a floating bearing bush soldered to the printed circuit board within the dam and including:
    a bearing ring having a tubular opening configured to receive a fastening bolt; and
    a soldering ring surrounding the bearing ring and including a lower edge soldered to the printed circuit board,
  wherein the soldering ring is cast in the casting compound, and
  wherein the bearing ring is suspended within the soldering ring, such that the bearing ring is movable at least in a radial direction relative to the soldering ring.

10. The control module as claimed in claim 9, further comprising:
  a fixed bearing bush soldered to the printed circuit board within the dam and defining an opening configured to receive the fastening bolt and that opens into a further bore in the printed circuit board.

\* \* \* \* \*

UNITED STATES PATENT AND TRADEMARK OFFICE
CERTIFICATE OF CORRECTION

| | |
|---|---|
| PATENT NO. | : 11,178,780 B2 |
| APPLICATION NO. | : 16/330638 |
| DATED | : November 16, 2021 |
| INVENTOR(S) | : Zweigle et al. |

It is certified that error appears in the above-identified patent and that said Letters Patent is hereby corrected as shown below:

In the Claims

In Claim 5, at Column 7, Lines 16-17: "having elastic the bearing elements" should read --having the bearing elements--.

Signed and Sealed this
Twenty-second Day of March, 2022

Drew Hirshfeld
*Performing the Functions and Duties of the*
*Under Secretary of Commerce for Intellectual Property and*
*Director of the United States Patent and Trademark Office*